(12) United States Patent
Sinha et al.

(10) Patent No.: US 10,825,745 B1
(45) Date of Patent: Nov. 3, 2020

(54) MULTI-DIE INTEGRATED CIRCUITS WITH IMPROVED TESTABILITY

(71) Applicant: Arm Limited, Cambridge (GB)

(72) Inventors: Saurabh Pijuskumar Sinha, San Antonio, TX (US); Xiaoqing Xu, Austin, TX (US); Joel Thornton Irby, Austin, TX (US); Mudit Bhargava, Austin, TX (US)

(73) Assignee: ARM LIMITED, Cambridge (GB)

( * ) Notice: Subject to any disclaimer, the term of this patent is extended or adjusted under 35 U.S.C. 154(b) by 0 days.

(21) Appl. No.: 16/666,816

(22) Filed: Oct. 29, 2019

(51) Int. Cl.
| | |
|---|---|
| *H01L 21/66* | (2006.01) |
| *H01L 25/18* | (2006.01) |
| *G06F 30/30* | (2020.01) |
| *G06F 30/333* | (2020.01) |

(52) U.S. Cl.
CPC .............. *H01L 22/34* (2013.01); *G06F 30/30* (2020.01); *H01L 25/18* (2013.01); *G06F 30/333* (2020.01)

(58) Field of Classification Search
None
See application file for complete search history.

(56) References Cited

U.S. PATENT DOCUMENTS

| 7,973,555 B1 * | 7/2011 | Trimberger | ...... H03K 19/17736 326/38 |
| 2016/0314232 A1 * | 10/2016 | Larzul | ................. G06F 30/331 |

* cited by examiner

*Primary Examiner* — Jany Richardson
(74) *Attorney, Agent, or Firm* — Talem IP Law, LLP

(57) ABSTRACT

A multi-die integrated circuit with improved testability can include at least two dies that combined comprise an integrated circuit for a self-contained system, which includes logic and design-for-test features. The integrated circuit is split into at least two portions, where each portion is disposed on a corresponding one of the at least two dies. As part of the improved testability for both pre-bond testing of logic and post-bond testing of inter-die connections, at least one of the at least two dies further comprises a split-circuit-boundary scan chain. An automated design tool can be used to determine optimal ways for the integrated circuit for a self-contained system to be split into at least two portions for the corresponding at least two dies. In addition, a split-circuit-boundary scan chain option can be applied for each portion, via the automated design tool, to ensure boundary scans are available on timing paths.

24 Claims, 5 Drawing Sheets

MULTI-DIE INTEGRATED CIRCUITS WITH IMPROVED TESTABILITY

BACKGROUND

In semiconductor device fabrication, yield is a critical factor in wafer processing costs. Yield refers to the ratio of the number of products sold to the number of products manufactured. In the context of an integrated circuit (IC), yield depends on the number of wafers that survive through the manufacturing line times the fraction of integrated circuits on each wafer that are fully functional at the end of the line.

Two factors that contribute to wafer manufacturing costs include: 1) the number of faults (functional and/or performance) within an IC; and 2) the time it takes for a wafer and the ICs on the dies of the wafer to complete processing and testing. Regarding the first factor, because the probability that a manufacturing flaw or "fault" will occur within an IC increases as the size of the die and the number of devices used to implement the IC increases, it can be more cost effective to implement an IC or system in the form of a multi-die IC or system instead of a monolithic die so that if one part of the circuitry contains a fault, then the other parts of the circuitry on other dies or even other wafers do not have to be discarded. Regarding the second factor, because improving time required to test a die reduces cost and being able to test the different components of a circuit improves reliability, most IC designs include built-for-test (also referred to as "design-for-test") features. A common design-for-test feature includes scan chains that involve interconnected flip-flops, multiplexers (MUXs) and shift registers.

As mentioned above, multi-die ICs and systems benefit from enabling each die to be tested separately. A multi-die system is a collection of independent integrated circuits (ICs) that can work together. Examples of multi-die systems include multi-core processors with one core design on one die and another core on another die that are coupled together and disposed in a single package and discrete memory and logic circuits that are coupled together and disposed in a single package. In contrast to a multi-die system in which separate ICs are independently designed and fabricated, a multi-die integrated circuit is a circuit formed from sub-circuits that are from one cohesive design, but fabricated on separate dies.

BRIEF SUMMARY

Multi-die integrated circuits with improved testability are provided. When an integrated circuit for a self-contained system is split into portions for implementation on separate dies, the existing design-for-test features may not be sufficient to support pre-bond testing of the logic so at least one of the portions of the integrated circuit receive one or more components to form a split-circuit-boundary scan chain that can be used for both pre-bond testing of logic and post-bond testing of inter-die connections (IDCs).

Accordingly, a multi-die integrated circuit can include at least two dies that combined comprise an integrated circuit for a self-contained system, wherein the integrated circuit is split into at least two portions, wherein each portion is disposed on a corresponding one of the at least two dies, wherein the integrated circuit comprises logic and design-for-test features; and at least one of the at least two dies further comprising a split-circuit-boundary scan chain at an inter-die boundary.

An automated design tool is provided that when executed by a computing system, directs the computing system to at least: import a netlist of an integrated circuit for a self-contained system, wherein the integrated circuit comprises logic and design-for-test features; split the integrated circuit into at least two portions according to one or more optimization criteria; store each portion as an independent netlist; and for each portion, apply a split-circuit-boundary scan chain option. The instructions to apply the split-circuit-boundary scan chain option direct the computing system to: identify whether the portion includes components of a scan chain from the design-for-test features disposed as a boundary scan chain for an inter-die boundary; and for any die-crossing timing paths of the portion that do not include the components of the scan chain from the design-for-test features, add additional components to form a split-circuit-boundary scan chain for the portion.

A method of testing a multi-die integrated circuit can include pre-bond testing each die of the multi-die integrated circuit; and post-bond testing inter-die connections by: loading the boundary scan chains on both sides of an inter-die connection of the inter-die connections; pulsing a clock signal on a receiving side of the inter-die connection; and determining whether captured data differs from expected data.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Multi-die integrated circuits with improved testability are provided. When an integrated circuit for a self-contained system is split into portions for implementation on separate dies, the existing design-for-test features may not be sufficient to support pre-bond testing of the logic so at least one of the portions of the integrated circuit receive one or more components to form a split-circuit-boundary scan chain that can be used for both pre-bond testing of logic and post-bond testing of inter-die connections (IDCs). An IDC refers to any electrical connection between two or more dies. A vertical connection is commonly referred to as an inter-tier via (ITV); and when disposed through a backside of a die, is commonly referred to as a through-silicon via (TSV).

An IC design often includes multiple stages of computations. A "stage" is a set of effectively parallel computations that are performed during a particular clock cycle. In the illustrated examples herein, a logic cloud is used to represent logic of an IC design. A logic cloud may include the logic of a single stage, of multiple stages, or just some of the logic found in a stage. When splitting an existing, self-contained, IC design into a multi-die IC design, the testing of the IC can be challenging because each die may not have a whole design. Indeed, the portion of the IC design on a die may be functionally incomplete. For existing IC designs, the arrangement of the design-for-test features typically include a boundary scan chain and certain intermediary scan chains (which may be part of functional blocks or test-specific blocks) that support the testing of logic within the system. When the IC design is split to be fabricated on multiple dies, the previously designed design-for-test features may not provide suitable coverage for testing the sub-component during pre-bond testing of the dies.

Figure 1:
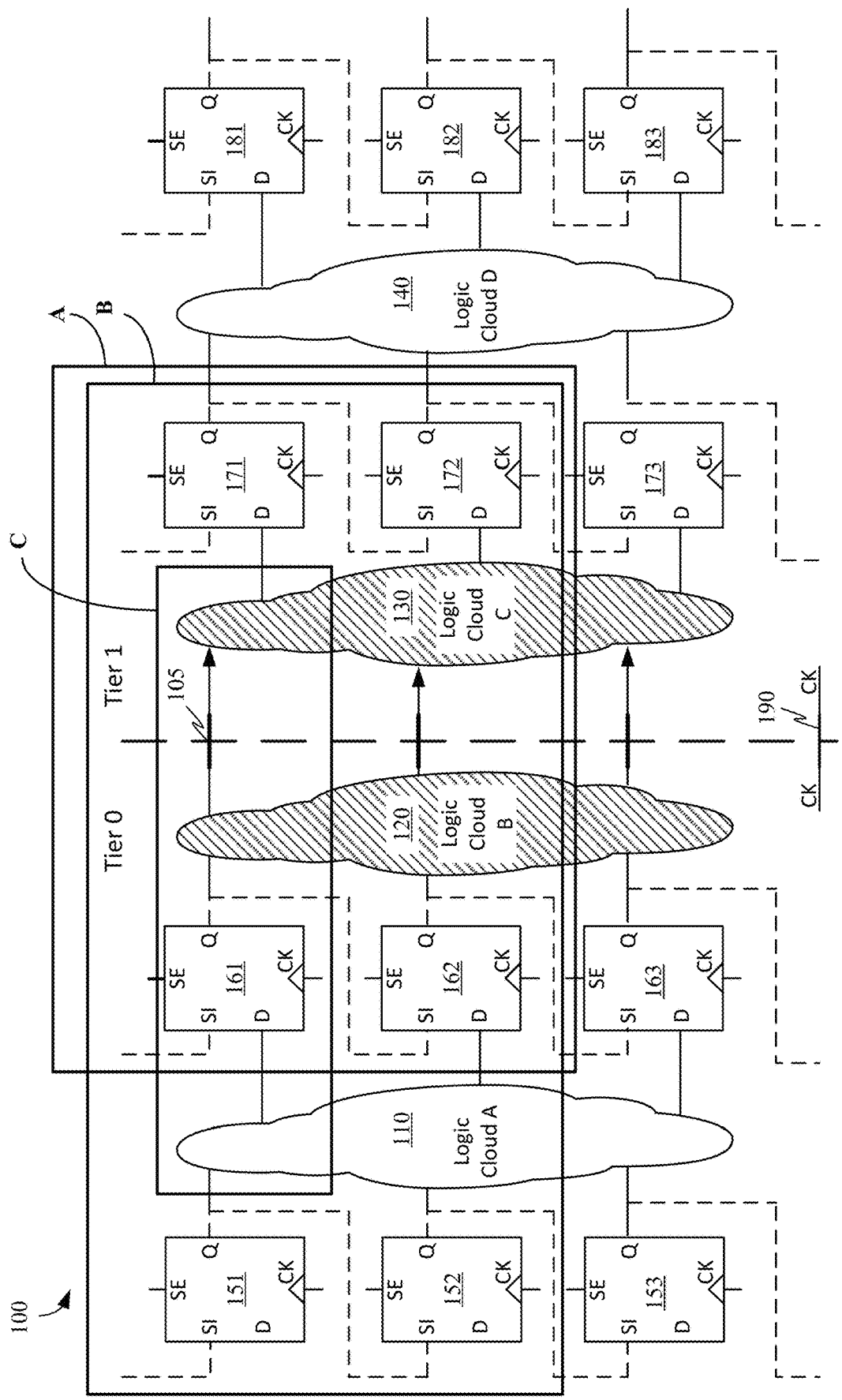
FIG. 1 illustrates an example arrangement of circuitry and design-for-test features that may occur when an existing IC design is split into two dies.

FIG. 1 illustrates an example arrangement of circuitry and design-for-test features that may occur when an existing IC design is split into two dies. Referring to FIG. 1, an existing IC design 100 may be split across two dies, which can be stacked as Tier 0 and Tier 1 with IDCs 105 coupling lines between the two, and include computational logic (e.g., logic portions) represented by logic cloud A 110, logic cloud B 120, logic cloud C 130, and logic cloud D 140. The existing design 100 also includes a scan chain of scan cells formed of flip-flops for testing the logic in the design. In this example, the flip-flops include a Scan Enable (SE) input, a Scan In (SI) input, a D input a clock input and a Q output; however other flip-flops may be used depending on the design.

Logic cloud B 120 and logic cloud C 130 may have originally been part of a same logic stage (and which may have been represented by a single logic cloud) in the original design, but when split across two dies, a portion forms logic cloud B 120 on one die and a portion forms logic cloud C 130 on the other die. For example, an IC design may have a plurality of AND gates that receive signals from a prior stage and whose outputs are captured by a flop for the next stage. These AND gates may or may not be operating on related signals, but are operating at the same time according to a same clock signal. The plurality of AND gates may, when the existing design is split into two, have some AND gates identified to be on one die and some AND gates identified to be on another die (e.g., optimization for signal path length from particular inputs or signal path length to a next stage) such that what was once all the same stage is now part of different logic clouds (but which may even still be intended to operate at the same time).

The split of one logic stage into Logic cloud B 120 and logic cloud C 130 results in possibly no scan cells in position to test the output of logic operations on the path between the two dies when the dies are not yet bonded. Although a design could be split to ensure a scan chain at a proper location for pre-bond test purposes (and also avoid splitting the single logic cloud in the original design into the separate logic clouds B 120 and C 130), the usual purpose for splitting a design across multiple dies is to optimize the split for reducing interconnections across an interface between two segments/dies and to reduce the delay (particularly on timing critical paths). Accordingly, it is likely that for performance purposes, a logic cloud may reside in a manner that is not testable, pre-bonding, when the existing design-for-test features are split.

For example, as shown in FIG. 1, there is a scan chain (e.g., with flip-flops 151, 152, 153) for input to Logic Cloud A 110; a scan chain (e.g., with flip-flops 161, 162, 163) capturing output from Logic Cloud A 110 and/or for input to Logic Cloud B 120; a scan chain (e.g., with flip-flops 171, 172, 173) capturing output from Logic Cloud C 130 and/or for input to Logic Cloud D 140; and a scan chain (e.g., with flip-flops 181, 182, 183) capturing output from Logic Cloud D 140. However, as can be seen in FIG. 1, there is no scan chain at the output of Logic Cloud B 120 or the input of Logic Cloud C 130, which results in logic that cannot be tested during pre-bond testing and the possibility that a faulty die will be bonded to a non-faulty die, causing the non-faulty die to be discarded.

In addition, during post-bond IDC testing (e.g., of IDCs 105 between logic, IDCs 190 for clock signals, and IDCs for power signals (not shown)), it may be challenging to identify whether a defective IDC 105 between logic is actually a defective IDC or if the error is due to a faulty logic gate (e.g., an open circuit) on one of the terminals of the IDC.

Figure 2:
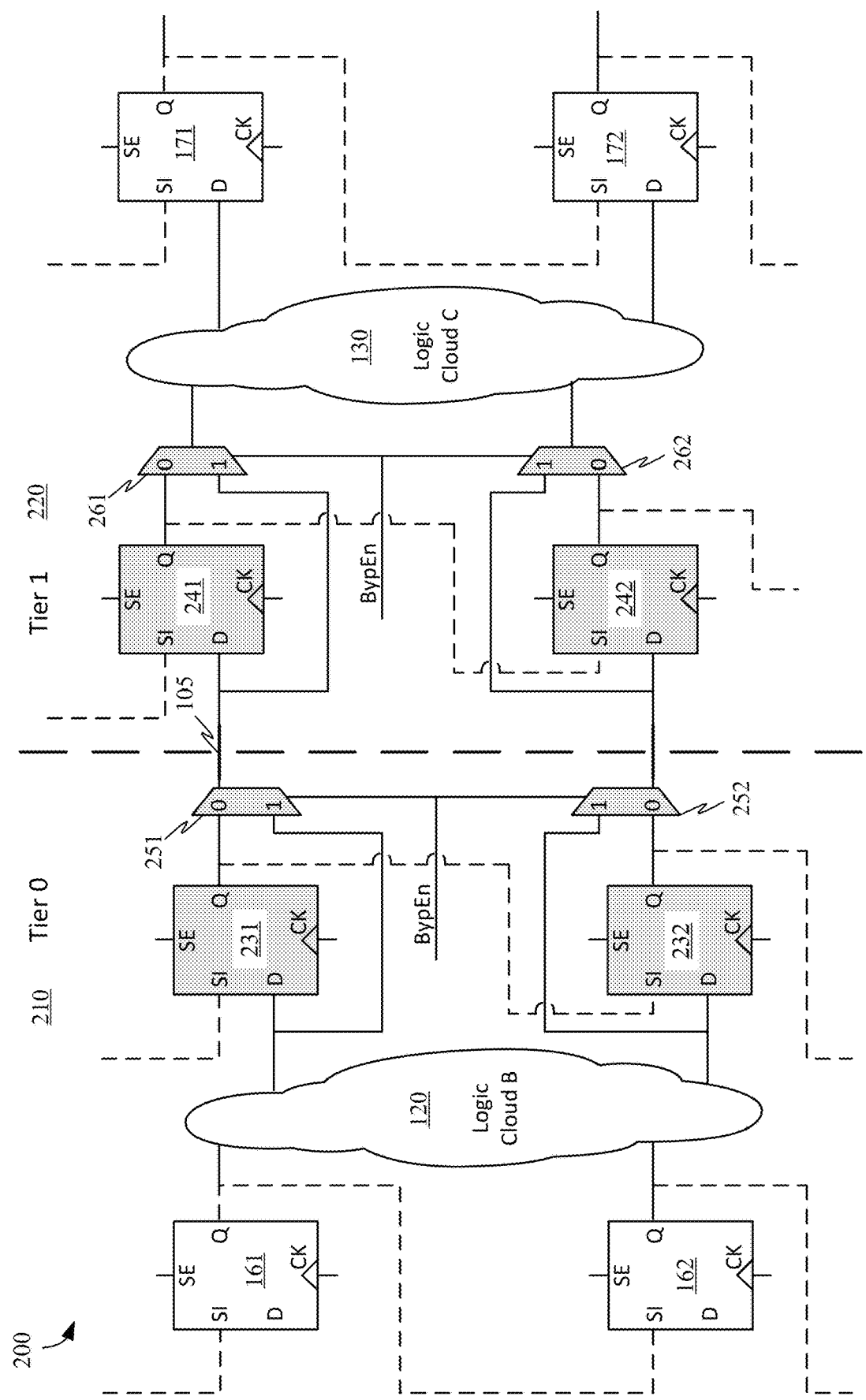
FIG. 2 illustrates a multi-die integrated circuit arrangement with improved testability.
Figure 3:
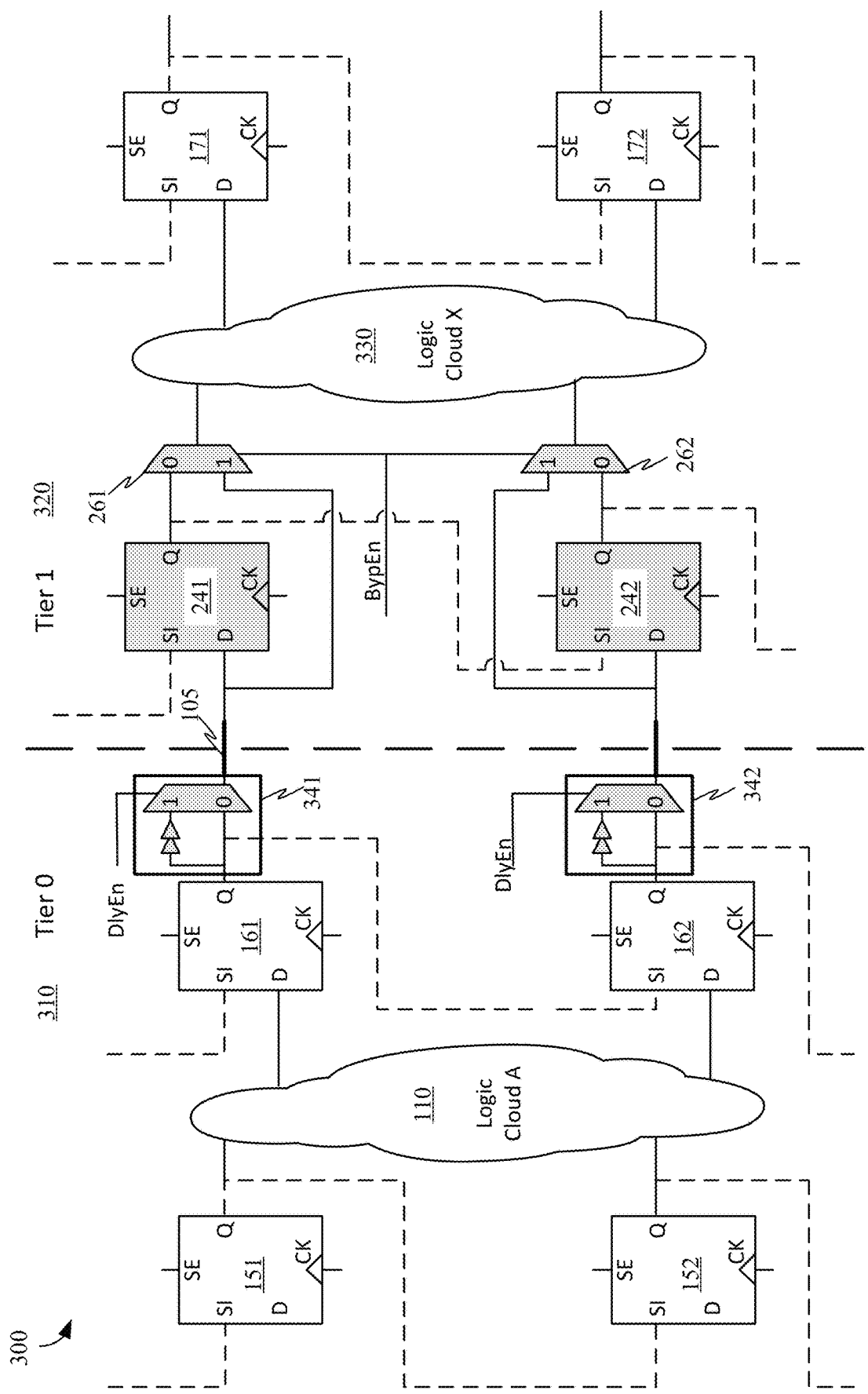
FIG. 3 illustrates a multi-die integrated circuit arrangement with improved testability and reduced overhead for at least one die as compared to the arrangement of FIG. 2.
Figure 4:
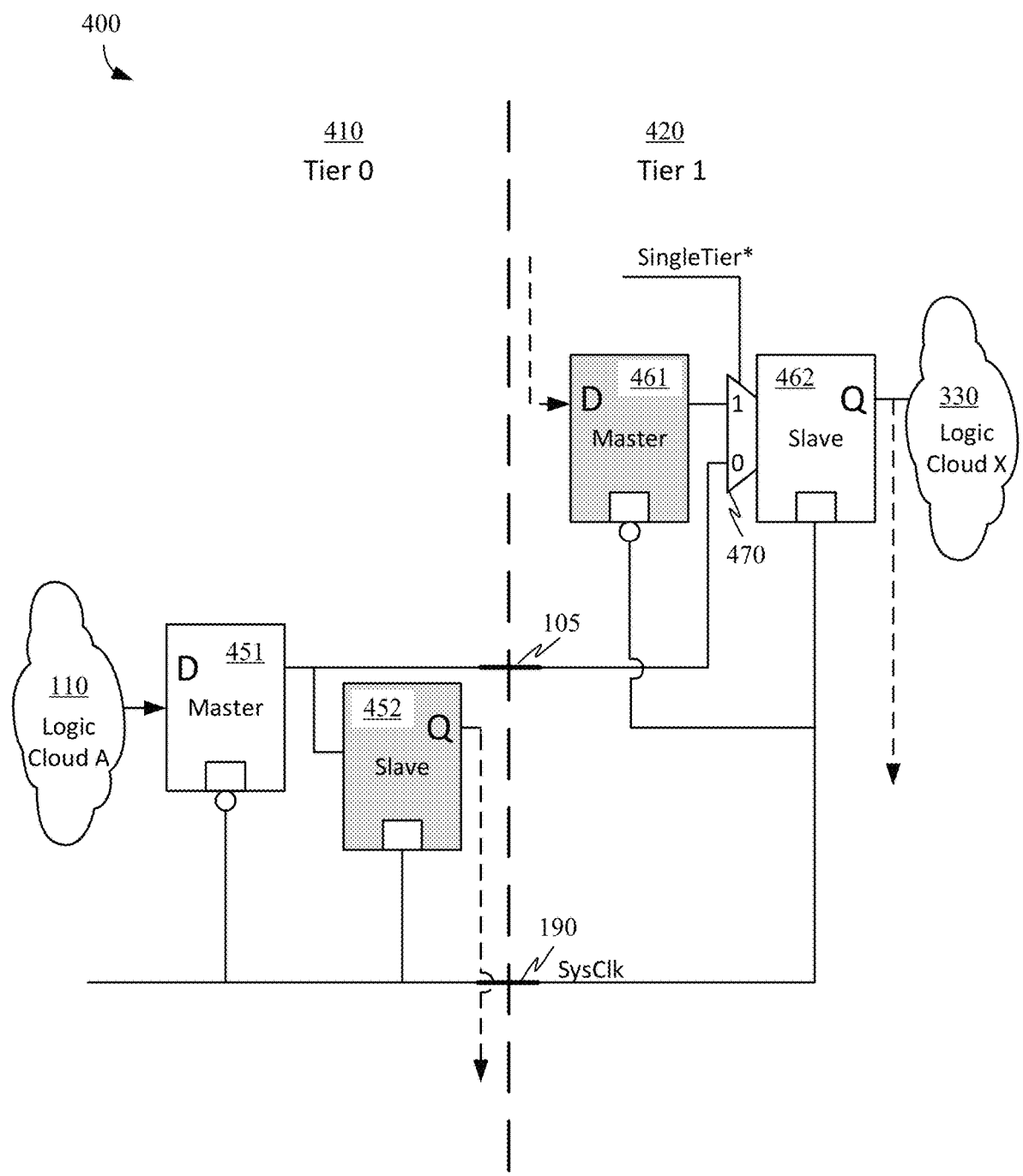
FIG. 4 illustrates a multi-die integrated circuit arrangement with improved testability and possible reduced overhead as compared to the arrangement of FIG. 2.

FIGS. 2-4 provide examples of circuits with improved testability as compared to the example arrangement of circuitry and design-for-test features in FIG. 1 that may occur when an existing IC design is split into two dies. Throughout the drawings, like reference numbers refer to like parts.

Advantageously, as illustrated in the examples of FIGS. 2-4 and described herein, testing features are provided that not only enable pre-bond testing of multi-die ICs, but also support post-bond testing and identification of faulty IDCs in a manner suitable for built-in self-test (BIST) and built-in-self-repair (BISR). In FIGS. 2-4, the aforementioned testing features, which are added to enable pre-bond testing and in some cases support post-bond testing of IDCs, are shown in gray. For ease of identification of parts, FIG. 1 further indicates the relationship between the example arrangement of circuitry with existing design-for-test features and the section of the circuitry shown in each of FIGS. 2, 3, and 4 as box A, box B, and box C, respectively.

FIG. 2 illustrates a multi-die integrated circuit arrangement with improved testability. Referring to FIG. 2, a multi-die integrated circuit 200 can include at least two dies, such as Tier 0 die 210 and Tier 1 die 220, that combined form an integrated circuit for a self-contained system with logic, such as logic cloud B 120 and logic cloud C 130, and design-for-test features, such as a scan chain (e.g., with flip-flops 161, 162) for input to Logic Cloud B 120 and a scan chain (e.g., with flip-flops 171, 172) capturing output from Logic Cloud C 130. The circuitry shown in FIG. 2 can be considered to correspond to box A of FIG. 1. For improved testability, at least one of the dies has a split-circuit-boundary scan chain inserted at the boundary (e.g., the inter-die boundary) within the integrated circuit. In the illustrated example, both dies have added testing features of the split-circuit-boundary scan chain (e.g., flip-flops 231, 232 for Tier 0 die 210 and flip-flops 241, 242 for Tier 1 die 220) and bypass MUX (e.g., bypass MUXs 251, 252 for Tier 0 die 210 and bypass MUXs 261, 262 for Tier 0 die 220).

In particular, where there is no design-for-test feature at the inter-die boundary, a split-circuit-boundary scan chain is added. For example, since there is no design-for test feature between logic cloud B 120 and the inter-die boundary (e.g., before IDC 105) in FIG. 1, a split-circuit-boundary scan chain (e.g., flip-flops 231, 232) is added to the Tier 0 die 210 as shown in FIG. 2; and since there is no design-for-test feature between the inter-die boundary (e.g., after IDC 105) and logic cloud C 130 in FIG. 1, a split-circuit-boundary scan chain (e.g., flip-flops 241, 242) is added to the Tier 1 die 220 as shown in FIG. 2.

The paths, or lines, on which a flip-flop of the split-circuit-boundary scan chain is applied when adding the new testing features can be any die-crossing path. Indeed, in some implementations every die crossing path has a test feature applied. The paths of interest for the described test features are collectively referred to as "timing paths" herein. A path is a computational path in which logic operations occur. A path may be represented as a physical conductive medium used to transmit data, such as a metal wire. The timing of a circuit as a whole is generally designed to be within a certain range. A circuit often includes many paths that connect components on a chip; and when an integrated circuit for a self-contained system is split into at least two portions, some of those paths are die-crossing paths that cross from one die to another die. The timing of signals along a path can be dependent on different factors, such as length of the path as well as dependencies and number of transistors or other components. Some paths will transmit signals faster than others. The paths with the longest delays are referred to as the "critical paths" or "timing critical paths".

As mentioned above, in the example shown in FIG. 2, wrapper flip-flops 231 and 232 of newly inserted split-circuit-boundary scan chain are included on Tier 0 die 210 and wrapper flip-flops 241 and 242 of newly inserted split-circuit-boundary scan chain are included on Tier 1 die 220. A bypass MUX (e.g., 251, 252, 261, 262) can be included that, under control of a bypass enable signal (BypEn), allows the functional signal to pass without the added delay of the flip-flop.

In some cases, instead of or in addition to a bypass MUX, a delay MUX can be included for use during post-bond testing. An example delay MUX is shown in FIG. 3.

FIG. 3 illustrates a multi-die integrated circuit arrangement with improved testability and reduced overhead for at least one die as compared to the arrangement of FIG. 2. The scenario illustrated in FIG. 3 may arise when the splitting of a self-contained system includes an optimization, during design phase, to partition at a flop boundary such that bypass MUXs are only required on one of two adjacent dies and fewer scan-only flops are needed. This optimization can reduce the delay introduced into the system and the area taken by the additional components as compared to the example shown in FIG. 2.

Referring to FIG. 3, instead of having a split in the IC design that creates Logic Cloud B 120 and Logic Cloud C 130 as shown in FIGS. 1 and 2, the logic that may have been part of Logic Cloud B 120 is pushed to the next die's layout, resulting in flip-flops (e.g., 161, 162) at the inter-die boundary. Referring to FIG. 3, a multi-die integrated circuit 300 can include at least two dies, such as Tier 0 die 310 and Tier 1 die 320, that when combined form an integrated circuit for a self-contained system with logic, such as logic cloud A 110 and logic cloud X 330, and design-for-test features, such as a scan chain (e.g., with flip-flops 151, 152) for input to Logic Cloud A 110; a scan chain (e.g., with flip-flops 161, 162) capturing output from Logic Cloud A 110 for input to a next logic cloud, which in this example, is Logic Cloud X 330 (but in FIG. 1 was split into logic such as Logic Cloud B 120); and a scan chain (e.g., with flip-flops 171, 172) capturing output from Logic Cloud X 330. As can be seen, in this example implementation, when the IC was split into at least two portions, some design-for-test features are available at the inter-die boundary. However, for improved testability, at least one of the dies has a split-circuit-boundary scan chain inserted at the new boundary (e.g., the inter-die boundary) within the integrated circuit.

Accordingly, similar to the example shown in FIG. 2, a split-circuit-boundary scan chain (e.g., with wrapper flip-flops 241 and 242 and optional bypass MUXs 261 and 262) is added at the inter-die boundary for the Tier 1 die 320. However, since there exists a design-for-test feature on Tier 0 die 310, no split-circuit-boundary scan chain is added to that die. Test-only flip-flops can be inserted on the other die/tier to facilitate both pre-bond testing of the logic (e.g., Logic Cloud X 330) and post-bond testing of the IDCs (e.g., IDC 105).

Delay MUXs (e.g., 341 and 342) can be used to add delay, for use during post bond testing, to minimize hold time violations between the flops at either side of the boundary (e.g., on Tier 0 die 310 or on Tier 1 die 320). In the illustrated example, the delay MUXs (e.g., 341 and 342) are added to Tier 0 die 310; however, in some implementations, delay MUXs may instead or in addition be added to the Tier 1 die 320. In normal functional mode, the extra delay is not needed (and may be undesirable). Therefore, the delay MUX can be a pass-gate MUX to minimize the delay and a delay enable signal (DlyEn) is used to control the delay MUX to bypass the delay when not needed. In some cases, hold time delays may be hard-wired, for example when there is enough timing slack from a flop at Tier 0 die 310 to a flop at Tier 1 die 320. In some cases, the delay can be adjustable (e.g., an adjustable delay can be provided). For example, the delay enable signal (DlyEn) may be a 2-bit signal, providing four possible delay options: no delay, some delay, more delay, and maximum delay. In some cases, hold time can be adjusted by adjusting clock delay instead of or in addition to the delay MUX.

FIG. 4 illustrates a multi-die integrated circuit arrangement with improved testability and possible reduced overhead as compared to the arrangement of FIG. 2. Similar to the scenario shown in FIG. 3, the splitting of a self-contained system includes an optimization, during design phase, to partition at a flop boundary such that there exists a flip-flop element between two logic clouds that are assigned to different dies; however, in the example of FIG. 4, a flip-flop element available from the original design-for-test features is split across the two dies.

In detail, referring to FIG. 4, a multi-die integrated circuit 400 can include at least two dies, such as Tier 0 die 410 and Tier 1 die 420, that combined form an integrated circuit for a self-contained system with logic, including logic cloud A 110 and logic cloud X 330, and design-for-test features, such as a scan chain of flops constructed using latches (e.g., master latch portion 451 and slave latch portion 462). Boundary flip-flops can be constructed using latches, for example a master-slave latch pair, where one portion is from an existing design-for-test feature and the other portion is added as the new testing feature for the circuit design.

In the illustrated example, a slave latch portion 452 is added to the Tier 0 die 410 to work in conjunction with the master latch portion 451 and a master latch portion 461 is added to the Tier 1 die 420 to work in conjunction with the slave latch portion 462. Here, Tier 0 die 410 has a master latch portion 451 having an input coupled to logic cloud A 110 on a die-crossing timing path and an output coupled to an added slave latch portion 452 and an inter-die connection 105. In addition, Tier 1 die 420 has a slave latch portion 462 having an output coupled to logic cloud X 330 on the die-crossing timing path and an input coupled to the inter-die connection 105 and the added master latch portion 461.

The master-slave latch pairs can be used during pre-bond testing of the die. For the die on a receiving end of a logic computation (e.g., cloud logic X 330 of Tier 1 die 420 receives computation output of cloud logic A 110 of Tier 0 die 410), a bypass MUX 470 can be coupled to the slave latch portion 462 that allows for the control of whether a signal from the IDC 105 (and therefore from cloud logic A 110 via master latch portion 451) or the added master latch portion 461 is received at the slave latch portion 462. The bypass MUX can be set using a signal SingleTier* and, in some cases, can be tied off after bonding.

It should be understood that although reference is made to "tiers" of dies, the described techniques and multi-die IC designs are suitable for various packaging structures, including current available packaging structures of 2D, 2.5D and 3D configurations. In a 3D configuration, the dies are stacked on top of each other with package level, wafer level, or silicon level integration (e.g., sequential 3D or monolithic 3D technology). In a 2.5D configuration, one or more dies are coupled to a substrate via an interposer, where the interposer can include circuitry the supports communication between the die. In a 2D configuration, the dies are mounted on the substrate side-by-side.

Figure 5:
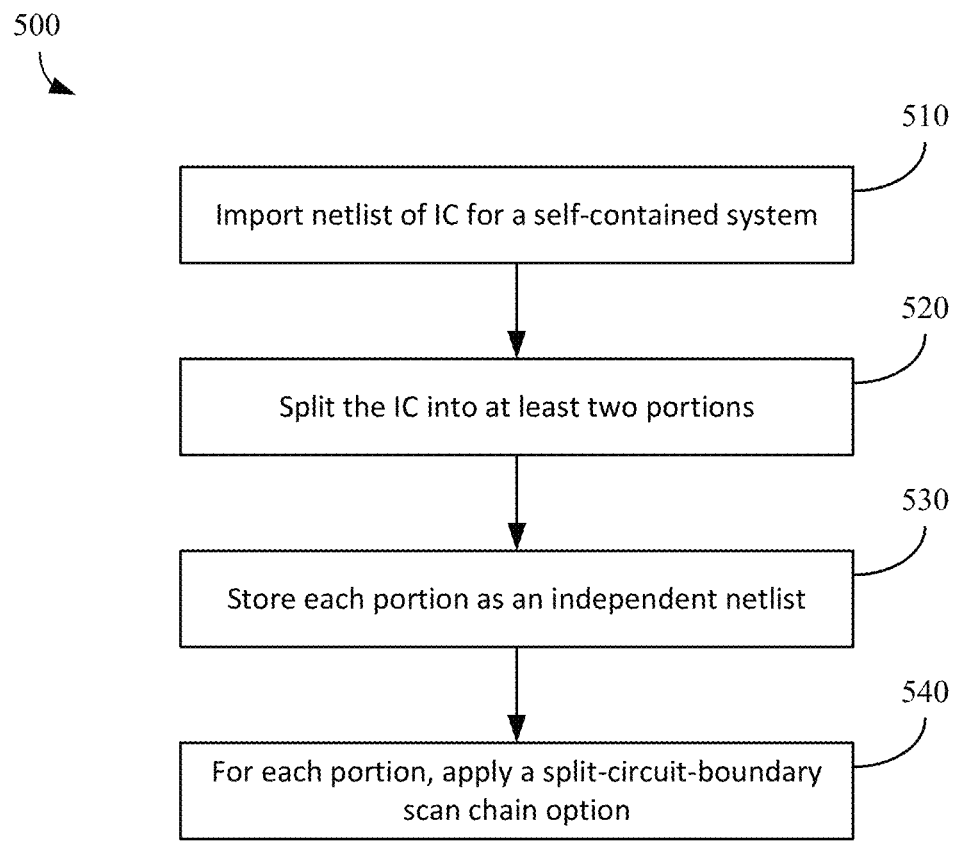
FIG. 5 illustrates an automated design tool process that can be used to design a multi-die integrated circuit with improved testability.

FIG. 5 illustrates an automated design tool process that can be used to design a multi-die integrated circuit with improved testability. An automated design tool can be instructions stored on a computer-readable storage medium, that when executed by a computing system, direct the computing system to perform the various functions of the automated design tool. The automated design tool can include functionality for importing a netlist. The netlist describes the components and connections of an integrated circuit. In some cases, a design may be described in a hardware description language such as Verilog or VHDL. For example, a process 500 carried out by the automated design tool can include importing (510) a netlist of an integrated circuit for a self-contained system. The integrated circuit for the self-contained contained system includes logic and design-for-test features.

The automated design tool can split (520) the integrated circuit into at least two portions according to one or more optimization criteria. The optimization criteria may be input or selected by a user; and the automated design tool can calculate optimized partitions based on the optimization criteria. For example, the optimization criteria can include an optimization for a stack arrangement to reduce signal path length. This would cause the automated design tool to determine, from layouts of the IC design, which signal paths would benefit from reduced signal path length and whether a reduction is possible if the components were on separate dies in a stack.

Once optimized partitions are generated, each portion of the IC can be stored (530) as an independent netlist. A split-circuit-boundary scan chain option can also be applied (540) for each portion. Applying (540) a split-circuit-boundary scan chain option can involve identifying whether the portion includes components of a scan chain from the design-for-test features disposed as a boundary scan chain for an inter-die boundary; and for any die-crossing timing paths of the portion that do not include the components of the scan chain from the design-for-test features, add additional components to form a split-circuit-boundary scan chain for the portion. The additional components may be any of the components described with respect to FIGS. 2-4, including, but not limited to, a flip-flop, bypass MUX, delay MUX (e.g., as a pass-gate MUX or with hard-wired hold time delay), a master-slave latch, a master latch portion, a slave latch portion, or a combination thereof.

In some cases, the automated design tool includes functionality to automatically apply a split-circuit-boundary scan chain option in response to a specific command or as part of the processes carried out to split the IC into at least two portions according to one or more optimization criteria.

In some cases, which split-circuit-boundary scan chain option can be based on one or more user-specified criteria.

An automated design tool can be implemented as a computer process, a computing system, or as an article of manufacture, such as a computer program product or computer-readable medium. Certain computer program products may be one or more computer-readable storage media readable by a computer system (and executable by a processing system) and encoding a computer program of instructions for executing a computer process. It should be understood that in no case is a computer-readable storage medium (or any storage media described herein) a transitory propagated signal.

As mentioned above, the added split-circuit-boundary scan chain(s) support post-bond testing of the IDCs. An example procedure for testing the IDC connections can include: loading a 1/0 into the Tier 0 boundary flop and a 0/1 into the corresponding Tier 1 boundary flop; pulsing the clock on the Tier 1 side; checking to see if captured data differs from expected data; loading the opposite polarity into the Tier 0 boundary flop and the corresponding Tier 1 boundary flop; pulsing the clock on the Tier 1 side; and checking to see if captured data differs from expected data. If both checks of captured data differ from expected data, then the IDC can be considered defective. Both polarities are tested to eliminate the possibility that the IDC is simply shorted to a supply voltage, ground, or some other voltage source. For implementations where it is not possible to separately pulse the Tier 1 clock without also pulsing the Tier 0 clock, the Scan Enable signal for the Tier 0 flop can be held high. In some cases, a delay can be applied to the signal path of the IDC to adjust a hold time, such as described with respect to a purpose for the delay MUX illustrated in FIG. 3.

The data values indicating which IDCs need repair will already be stored in the capturing flops on Tier 1. Any flop that contains the opposite of the background value is considered to need repair. Assuming that sufficient redundant IDCs are available, the chip can be repaired by connected an available IDC in place of a faulty IDC according to any suitable method/structures.

In some cases, after swapping or selecting a replacement IDC, the post bond testing of the IDC may be carried out again.

The test time for the IDCs is roughly equal to four (4) times the clock period multiplied by the number (N) of IDC boundary flip-flops, since the boundary flip-flops are accessed serially, and both the 1 and 0 transmission are tested across the tier boundary. For example, first, with SE=1 on both tiers, all flip-flops in Tier 0 are loaded with 1/0, and corresponding flip-flops in Tier 1 are loaded with 0/1. Then, with SE=0, the clock on the receiving tier is pulsed once; since shifting through each boundary scan chain flip-flop will take longer than one clock cycle (indeed, it takes N clock cycles) this single clock cycle can be ignored in this estimate. Next, the test results are serially shifted out, taking another N clock cycles. Finally, the whole process is repeated for the opposite data polarity.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A multi-die integrated circuit comprising:
at least two dies that combined comprise an integrated circuit for a self-contained system, wherein the integrated circuit is split into at least two portions, wherein each portion is disposed on a corresponding one of the at least two dies, wherein the integrated circuit comprises logic and design-for-test features, wherein at least one portion of the at least two portions is functionally incomplete; and
at least one of the at least two dies further comprising a split-circuit-boundary scan chain at an inter-die boundary.

2. The multi-die integrated circuit of claim 1, wherein the split-circuit-boundary scan chain comprises a flip-flop on a die-crossing timing path, the die further comprising a bypass MUX for that die-crossing timing path.

3. The multi-die integrated circuit of claim 2, wherein the die further comprises a delay MUX for that die-crossing timing path.

4. The multi-die integrated circuit of claim 1, wherein, a first die of the at least two dies is coupled to a second die of the at least two dies, wherein the first die has a boundary scan chain from the design-for-test features at an inter-die boundary between the first die and the second die and a delay MUX for a die-crossing timing path to the second die, wherein the second die has the split-circuit-boundary scan chain at the inter-die boundary between the first die and the second die.

5. The multi-die integrated circuit of claim 1, wherein the split-circuit-boundary scan chain at the inter-die boundary comprises an added slave latch portion or an added master latch portion on a die-crossing timing path.

6. The multi-die integrated circuit of claim 5, wherein a first die of the at least two dies comprises a master latch portion having an input coupled to a logic portion of the first die on the die-crossing timing path and an output coupled to the added slave latch portion and an inter-die connection; and
wherein a second die of the at least two dies comprises a slave latch portion having an output coupled to a logic portion of the second die on the die-crossing timing path and an input coupled to the inter-die connection and the added master latch portion.

7. The multi-die integrated circuit of claim 6, further comprising a bypass MUX coupled to control whether a signal from the inter-die connection or the added master latch portion is received at the slave latch portion of the second die.

8. The multi-die integrated circuit of claim 1, wherein the at least two dies are coupled in a 3D packaging configuration.

9. The multi-die integrated circuit of claim 1, wherein the at least two dies are coupled in a 2.5D packaging configuration.

10. The multi-die integrated circuit of claim 1, wherein the at least two dies are coupled in a 2D packaging configuration.

11. A computer-readable storage medium having stored thereon instructions for an automated design tool that when executed by a computing system, directs the computing system to at least:
import a netlist of an integrated circuit for a self-contained system, wherein the integrated circuit comprises logic and design-for-test features;
split the integrated circuit into at least two portions according to one or more optimization criteria;
store each portion as an independent netlist; and
for each portion, apply a split-circuit-boundary scan chain option.

12. The medium of claim 11, wherein the one or more optimization criteria comprises:
an optimization for a stack arrangement to reduce signal path length.

13. The medium of claim 11, wherein the instructions to apply a split-circuit-boundary scan chain option direct the computing system to:
identify whether the portion includes components of a scan chain from the design-for-test features disposed as a boundary scan chain for an inter-die boundary; and
for any die-crossing timing paths of the portion that do not include the components of the scan chain from the design-for-test features, add additional components to form a split-circuit-boundary scan chain at the inter-die boundary for the portion.

14. The medium of claim 13, wherein the additional components comprise a flip-flop and a bypass MUX.

15. The medium of claim 13, wherein the additional components comprise a flip-flop and a pass-gate MUX.

16. The medium of claim 13, wherein the additional components comprise a flip-flop and an adjustable delay.

17. The medium of claim 13, wherein the additional components comprise a slave latch portion or a master latch portion.

18. A method of testing a multi-die integrated circuit comprising at least two dies that combined comprise an integrated circuit for a self-contained system, wherein the integrated circuit is split into at least two portions, wherein each portion is disposed on a corresponding one of the at least two dies, wherein the integrated circuit comprises logic and design-for-test features; and at least one of the at least two dies further comprises a split-circuit-boundary scan chain at an inter-die boundary such that each die has a boundary scan chain, the method comprising:
pre-bond testing each die of the multi-die integrated circuit; and
post-bond testing inter-die connections by:
loading the boundary scan chains on both sides of an inter-die connection of the inter-die connections;
pulsing a clock signal on a receiving side of the inter-die connection; and
determining whether captured data differs from expected data.

19. The method of claim 18, further comprising:
applying a delay to a signal path through the inter-die connection to adjust a hold time.

20. A multi-die integrated circuit comprising:
at least two dies that combined comprise an integrated circuit for a self-contained system, wherein the integrated circuit is split into at least two portions, wherein each portion is disposed on a corresponding one of the at least two dies, wherein the integrated circuit comprises logic and design-for-test features; and
at least one of the at least two dies further comprising:
a split-circuit-boundary scan chain at an inter-die boundary, wherein the split-circuit-boundary scan chain comprises a flip-flop on a die-crossing timing path;
a bypass MUX for that die-crossing timing path; and
a delay MUX for that die-crossing timing path.

21. A multi-die integrated circuit comprising:
at least two dies that combined comprise an integrated circuit for a self-contained system, wherein the integrated circuit is split into at least two portions, wherein each portion is disposed on a corresponding one of the at least two dies, wherein the integrated circuit comprises logic and design-for-test features; and at least one of the at least two dies further comprising a split-circuit-boundary scan chain at an inter-die boundary, wherein, a first die of the at least two dies is coupled to a second die of the at least two dies, wherein the first die has a boundary scan chain from the design-for-test features at an inter-die boundary between the first die and the second die and a delay MUX for a die-crossing timing path to the second die, wherein the second die has the split-circuit-boundary scan chain at the inter-die boundary between the first die and the second die.

22. A multi-die integrated circuit comprising:

at least two dies that combined comprise an integrated circuit for a self-contained system, wherein the integrated circuit is split into at least two portions, wherein each portion is disposed on a corresponding one of the at least two dies, wherein the integrated circuit comprises logic and design-for-test features; and at least one of the at least two dies further comprising a split-circuit-boundary scan chain at an inter-die boundary, wherein the split-circuit-boundary scan chain at the inter-die boundary comprises an added slave latch portion or an added master latch portion on a die-crossing timing path.

23. The multi-die integrated circuit of claim 22, wherein a first die of the at least two dies comprises a master latch portion having an input coupled to a logic portion of the first die on the die-crossing timing path and an output coupled to the added slave latch portion and an inter-die connection; and wherein a second die of the at least two dies comprises a slave latch portion having an output coupled to a logic portion of the second die on the die-crossing timing path and an input coupled to the inter-die connection and the added master latch portion.

24. The multi-die integrated circuit of claim 23, further comprising a bypass MUX coupled to control whether a signal from the inter-die connection or the added master latch portion is received at the slave latch portion of the second die.

* * * * *